(12) United States Patent
Hwang et al.

(10) Patent No.: US 8,637,927 B2
(45) Date of Patent: Jan. 28, 2014

(54) SEMICONDUCTOR DEVICES AND METHODS OF FORMING THE SAME

(75) Inventors: Heedon Hwang, Yongin-si (KR); Ji-Young Min, Seoul (KR); Jongchul Park, Hwaseong Si (KR); Insang Jeon, Seoul (KR); Woogwan Shim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 38 days.

(21) Appl. No.: 13/267,267

(22) Filed: Oct. 6, 2011

(65) Prior Publication Data
US 2012/0086074 A1  Apr. 12, 2012

(30) Foreign Application Priority Data

Oct. 6, 2010 (KR) .................. 10-2010-0097388

(51) Int. Cl.
*H01L 21/00* (2006.01)
(52) U.S. Cl.
USPC .................. 257/334; 257/343; 257/E21.253; 257/E29.239
(58) Field of Classification Search
USPC ....................................................... 257/334
See application file for complete search history.

(56) References Cited

U.S. PATENT DOCUMENTS

| 7,675,110 | B2 | 3/2010 | Uchiyama |
| 7,723,755 | B2 | 5/2010 | Lee et al. |
| 2008/0211057 | A1* | 9/2008 | Lee et al. ............. 257/520 |
| 2011/0027988 | A1* | 2/2011 | Hwang et al. ......... 438/656 |
| 2011/0156135 | A1* | 6/2011 | Yoon et al. ............ 257/330 |

FOREIGN PATENT DOCUMENTS

| JP | 2003-037184 | 2/2003 |
| JP | 2006-135117 | 5/2006 |
| KR | 1020080064372 | 7/2008 |

\* cited by examiner

*Primary Examiner* — Michael Ledentritt
(74) *Attorney, Agent, or Firm* — Myers Bigel Sibley & Sajovec PA

(57) ABSTRACT

Semiconductor devices and methods of forming the same may be provided. The semiconductor devices may include a trench in a substrate. The semiconductor devices may also include a bulk electrode within opposing sidewalls of the trench. The semiconductor devices may further include a liner electrode between the bulk electrode and the opposing sidewalls of the trench. The liner electrode may include a sidewall portion between a sidewall of the bulk electrode and one of the opposing sidewalls of the trench.

16 Claims, 17 Drawing Sheets

SEMICONDUCTOR DEVICES AND METHODS OF FORMING THE SAME

CROSS-REFERENCE TO RELATED APPLICATIONS

This U.S. non-provisional patent application claims priority under 35 U.S.C. §119 to Korean Patent Application No. 10-2010-0097388, filed on Oct. 6, 2010, the disclosure of which is hereby incorporated by reference in its entirety.

BACKGROUND

The present inventive concept herein relates to semiconductor devices and methods of forming the same.

In electronics industries such as mobile phone and notebook computer industries, demand has increased for products that are lighter and smaller yet also high-speed, multi-functional, high-performance, high-reliability, and low-priced. In order to address these demands, the integration density and process margin of semiconductor devices have increased.

In particular, research has been undertaken regarding various types of word lines capable of increasing integration density and effective channel length.

SUMMARY

According to some embodiments, semiconductor devices may include a trench in a substrate. The devices may also include a bulk electrode within opposing sidewalls of the trench. The devices may further include a liner electrode between the bulk electrode and the opposing sidewalls of the trench. The devices may additionally include a gate dielectric between the liner electrode and the opposing sidewalls of the trench. In some embodiments, the liner electrode may include a sidewall portion that is between a sidewall of the bulk electrode and one of the opposing sidewalls of the trench. In some embodiments, a top surface of the bulk electrode may be higher than a top surface of the sidewall portion of the liner electrode and lower than a top surface of the substrate.

In some embodiments, the liner electrode may further include a bottom portion that is between the bulk electrode and a bottom surface of the trench.

In some embodiments, the liner electrode may further include a material having a resistivity higher than the bulk electrode.

In some embodiments, the liner electrode and the bulk electrode may include at least one of metal and conductive metal nitride.

In some embodiments, the liner electrode and the bulk electrode may include materials having different etch selectivities.

In some embodiments, the liner electrode may include titanium nitride, and the bulk electrode may include tungsten.

In some embodiments, the liner electrode and the bulk electrode may include materials that include a common element. Also, the liner electrode may include a physical vapor deposition (PVD)-conductive material, and the bulk electrode may include a chemical vapor deposition (CVD)-conductive material.

In some embodiments, the liner electrode may include PVD-titanium nitride, and the bulk electrode may include CVD-titanium nitride.

In some embodiments, the devices may further include a capping pattern on the liner electrode and the bulk electrode within the opposing sidewalls of the trench.

According to some embodiments, methods of forming semiconductor devices may include forming a trench in a substrate. The methods may also include forming a gate dielectric conformally covering opposing sidewalls and a bottom surface of the trench. The methods may further include conformally forming a liner electrode layer on the gate dielectric. The methods may additionally include forming a bulk electrode layer on the liner electrode layer to substantially fill the trench. The methods may also include etching the bulk electrode layer and the liner electrode layer to form a liner electrode and a bulk electrode recessed within the opposing sidewalls of the trench. In some embodiments, the liner electrode may include a sidewall portion between a sidewall of the bulk electrode and one of the sidewalls of the trench. In some embodiments, a top surface of the bulk electrode may be higher than a top surface of the sidewall portion of the liner electrode and lower than a top surface of the substrate.

In some embodiments, the methods may further include forming a capping pattern on the liner electrode and the bulk electrode within the opposing sidewalls of the trench.

In some embodiments, the liner electrode and the bulk electrode may be formed by a single dry etching process.

In some embodiments, the liner electrode layer may be formed by a physical vapor deposition process, and the bulk electrode layer may be formed by a chemical vapor deposition process.

In some embodiments, the bulk electrode layer may be formed of a material having a resistivity lower than the liner electrode layer.

In some embodiments, the methods may further include, before forming the liner electrode layer, performing at least one of a nitridation treatment and an ozonization treatment on a surface of the gate dielectric and the top surface of the substrate.

According to some embodiments, semiconductor devices may include a plurality of trenches that are spaced apart on a substrate. Each trench among the plurality of trenches may include a bulk electrode within opposing sidewalls of the trench. Each trench among the plurality of trenches may also include a liner electrode between the bulk electrode and the opposing sidewalls of the trench such that a protruding portion of the bulk electrode protrudes beyond opposing sidewalls of the liner electrode. Each trench among the plurality of trenches may further include a capping pattern on the protruding portion of the bulk electrode within opposing sidewalls of the trench. The semiconductor devices may also include source/drain regions between the plurality of trenches such that portions of the opposing sidewalls of the liner electrode overlap sidewalls of the source/drain regions. The semiconductor devices may further include contact plugs on the source/drain regions and on portions of the plurality of trenches.

In some embodiments, the semiconductor devices may further include an interlayer dielectric layer on the capping pattern. Also, in some embodiments, the protruding portion of the bulk electrode may be closer than the opposing sidewalls of the liner electrode to the interlayer dielectric layer.

In some embodiments, protruding portions of the contact plugs may protrude into the trench to overlap portions of the opposing sidewalls of the liner electrode. Also, in some embodiments, the opposing sidewalls of the liner electrode may be closer to the protruding portions of the contact plugs than to interlayer dielectric layer. Moreover, in some embodiments, the capping pattern may be between the opposing sidewalls of the liner electrode and the protruding portions of the contact plugs.

In some embodiments, each trench among the plurality of trenches may further include a gate dielectric between the liner electrode and the opposing sidewalls of the trench. Also, in some embodiments, the plurality of trenches may include first and second trenches in the substrate. The plurality of trenches may further include third and fourth trenches adjacent first and second sidewalls of the substrate, respectively. In some embodiments, the source/drain regions may include a first source/drain region between the first and second trenches. Also, in some embodiments, the source/drain regions may further include a pair of second source/drain regions, one of which may be between the first and third trenches, and another of which may be between the second and fourth trenches. Moreover, in some embodiments, the first source/drain region may be between the pair of second source/drain regions.

In some embodiments, the third and fourth trenches may be larger than the first and second trenches.

BRIEF DESCRIPTION OF THE DRAWINGS

The above and other features and advantages of the disclosure will become more apparent by describing in detail example embodiments thereof with reference to the attached drawings in which.

DETAILED DESCRIPTION

Figure 1:
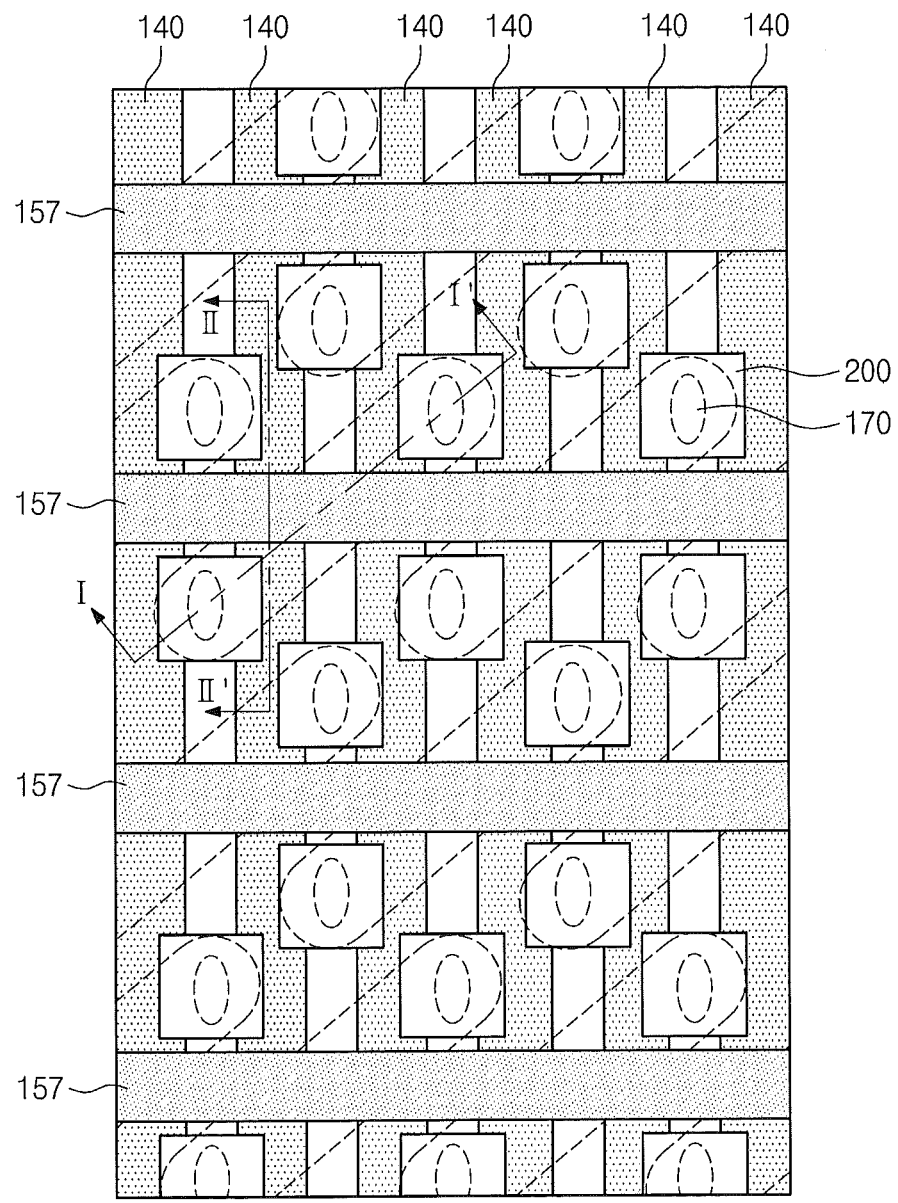
FIG. 1 is a plan view illustrating a semiconductor device according to some embodiments.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout.

Example embodiments are described herein with reference to cross-section illustrations that are schematic illustrations of idealized example embodiments (and intermediate structures). As such, variations from the shapes of the illustrations as a result, for example, of manufacturing techniques and/or tolerances, are to be expected. Thus, example embodiments may not be construed as limited to the particular shapes of regions illustrated herein but may be construed to include deviations in shapes that result, for example, from manufacturing.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

It will be understood that, although the terms first, second, etc. may be used herein to describe various elements, these elements should not be limited by these terms. These terms are only used to distinguish one element from another. Thus, a first element could be termed a second element without departing from the teachings of the present embodiments.

Unless otherwise defined, all terms (including technical and scientific terms) used herein have the same meaning as commonly understood by one of ordinary skill in the art to which these embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2A:
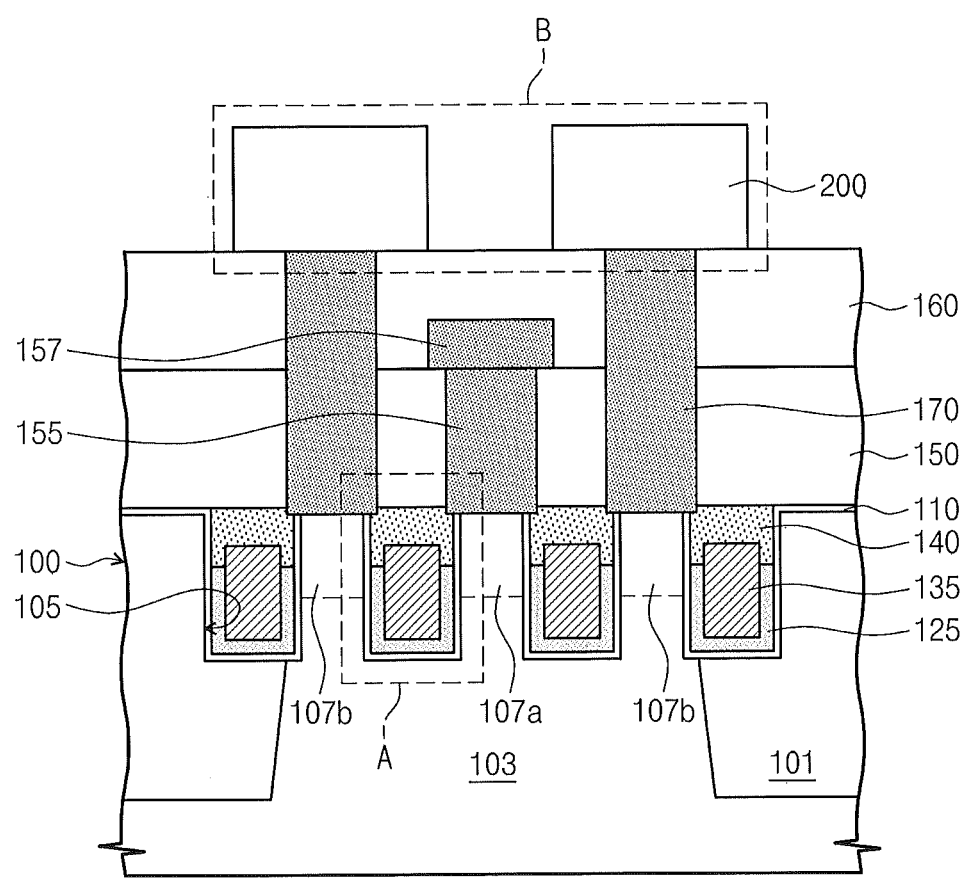
FIG. 2A is a cross-sectional view taken along the line I-I' of FIG. 1 illustrating a semiconductor device according to some embodiments.
Figure 2B:
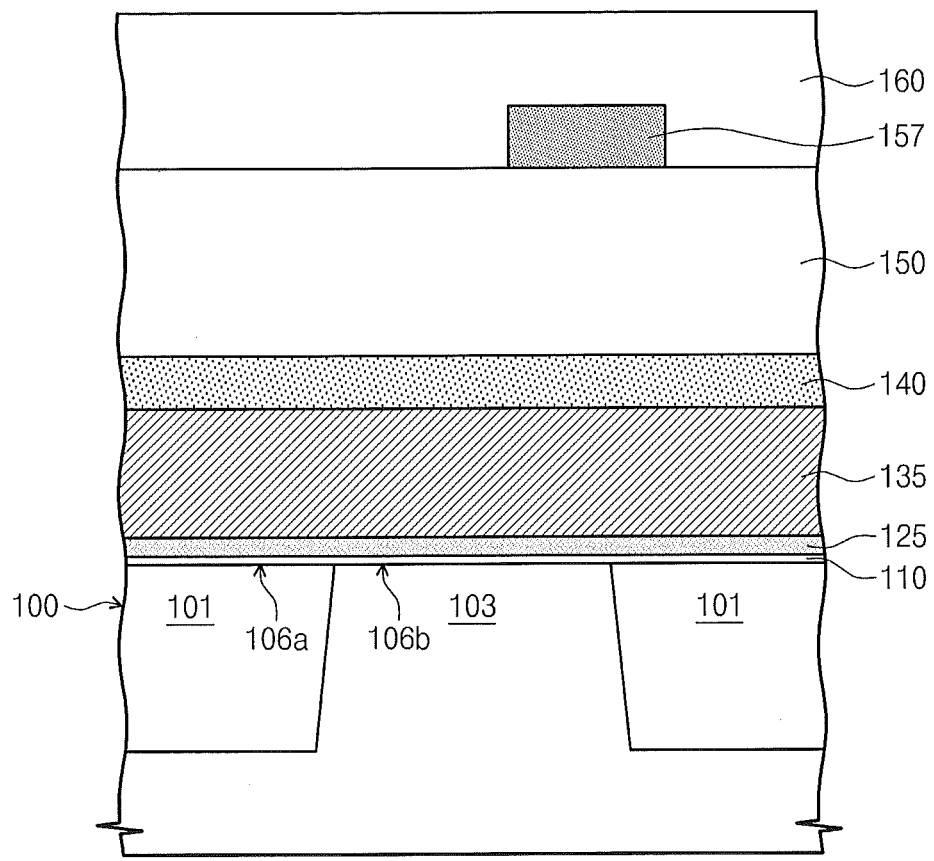
FIG. 2B is a cross-sectional view taken along the line II-II' of FIG. 1 illustrating a semiconductor device according to some embodiments.
Figure 2C:
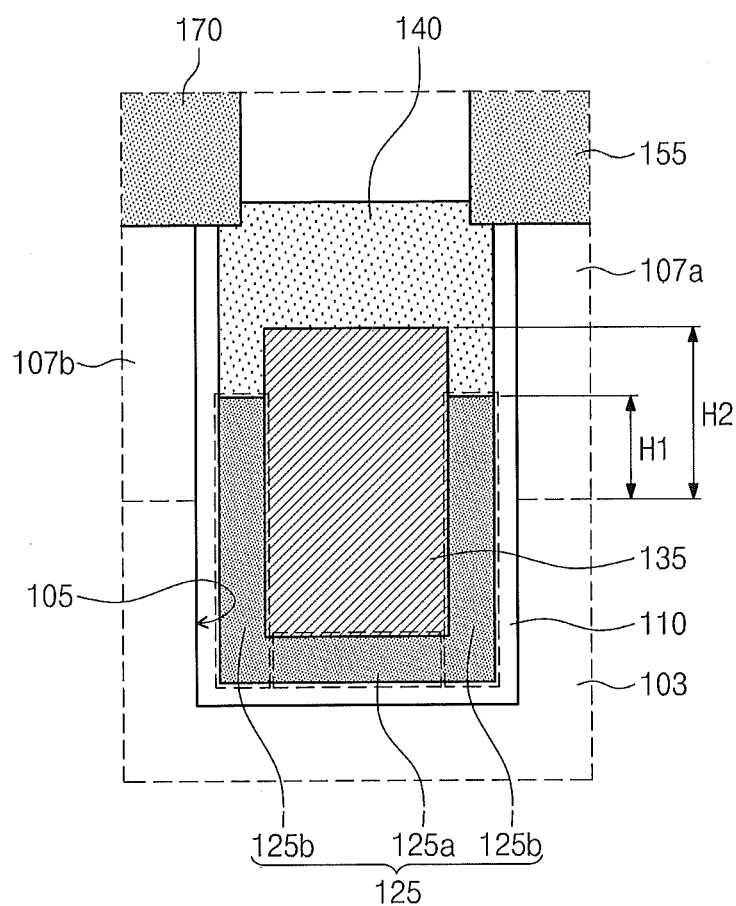
FIG. 2C is an enlarged view of the portion 'A' in FIG. 2A.

FIG. 1 is a plan view illustrating a semiconductor device according to some embodiments. FIG. 2A is a cross-sectional view taken along the line I-I' of FIG. 1, and FIG. 2B is a cross-sectional view taken along the line II-II' of FIG. 1. FIG. 2C is an enlarged view of the portion 'A' in FIG. 2A.

Referring to FIGS. 2A and 2B, a device isolation layer 101 defining an active region 103 may be disposed in/on a substrate 100. The device isolation layer 101 may be a shallow trench isolation (STI) layer, but it is not limited thereto. The device isolation layer 101 may include an insulating material. For example, the device isolation layer 101 may include at least one of silicon oxide, silicon nitride, and silicon oxynitride. The substrate 100 may include a semiconductor material. For example, the substrate 100 may include at least one of silicon and germanium.

Trenches 105 may be disposed in the substrate 100. As illustrated in FIG. 2A, some of the trenches 105 may have a linear configuration crossing over/into the active region 103 and the device isolation layer 101 by extending in one direction when viewed from the top. For example, some of the trenches 105 may extend from the device isolation layer 101 into an adjacent portion of the active region 103. According to some embodiments, more than one (e.g., a pair) of the trenches 105 may cross over/into the active region 103.

Referring to FIG. 2B, according to some embodiments, the trench 105 may include a first bottom surface 106a and a second bottom surface 106b. The first bottom surface 106a may be disposed in the device isolation layer 101. The second bottom surface 106b may be disposed in the active region 103. The first bottom surface 106a and the second bottom surface 106b may be positioned at substantially the same level. For example, the first bottom surface 106a and the second bottom surface 106b may be substantially coplanar.

Referring again to FIG. 2A, a bulk electrode 135 may be disposed in the trench 105. As further illustrated in FIG. 2B, the bulk electrode 135 may have a linear configuration crossing over/into the active region 103 and the device isolation layer 101 when viewed from the top. A top surface of the bulk electrode 135 may be lower than a top surface of the substrate 100. Therefore, the bulk electrode 135 may have a buried configuration in the trench 105.

Referring to FIGS. 2A and 2C, a liner electrode 125 may be disposed between the bulk electrode 135 and inner surfaces of the trench 105 (e.g., opposing sidewalls within the trench 105). As illustrated in FIG. 2C, the liner electrode 125 may include a bottom portion 125a disposed between the bulk electrode 135 and a bottom surface of the trench 105, and a pair of sidewall portions 125b extending upward from the bottom portion 125a along the respective opposing sidewalls of the trench 105. Accordingly, each sidewall portion 125b may be disposed between the bulk electrode 135 and one sidewall of the trench 105. According to some embodiments, a cross-section of the liner electrode 125 may have a U-shape that covers sidewalls and a bottom surface of the bulk electrode 135. A top surface of the sidewall portion 125b of the liner electrode 125 may be lower (e.g., closer to the bottom portion 125a) than a top surface of the bulk electrode 135. As such, the bulk electrode 135 may include a portion that protrudes from the top surface of the sidewall portion 125b of the liner electrode 125.

The liner electrode 125 and the bulk electrode 135 in the trench 105 may be included in a gate electrode. According to some embodiments, as illustrated in FIG. 2A, a pair of trenches 105 crosses over/into the active region 103 such that a pair of gate electrodes including the liner electrode 125 and the bulk electrode 135 may cross over/into the active region 103. The bulk electrode 135 and the liner electrode 125 may include a conductive material. For example, the bulk electrode 135 and the liner electrode 125 may include at least one of doped-semiconductor, conductive metal nitride (e.g., titanium nitride, tantalum nitride, or tungsten nitride, etc.), and metal (e.g., ruthenium, iridium, titanium, tungsten, or tantalum, etc.).

According to some embodiments, the bulk electrode 135 may include a material having a resistivity lower than that of the liner electrode 125. As such, materials included in the bulk electrode 135 and the liner electrode 125 may have different etch selectivities. For example, the liner electrode 125 may include titanium nitride, and the bulk electrode 135 may include tungsten.

Alternatively, the liner electrode 125 and the bulk electrode 135 may include materials composed of the same (or substantially the same) elements. As such, the liner electrode 125 may include a physical vapor deposition (PVD)-conductive material, and the bulk electrode 135 may include a chemical vapor deposition (CVD)-conductive material. For example, the liner electrode 125 may include PVD-titanium nitride, and the bulk electrode 135 may include a CVD-titanium nitride. Accordingly, the liner electrode 125 may be etched faster than the bulk electrode 135 under the same dry etching conditions.

The liner electrode 125 may function as a barrier for the bulk electrode 135. Also, the liner electrode 125 may control the effective work function of the bulk electrode 135.

Referring again to FIGS. 2A and 2C, source/drain regions 107a and 107b may be disposed in the active region 103 at both sides of the trenches 105. According to some embodiments, a first source/drain region 107a and a pair of second source/drain regions 107b may be disposed in the active region 103, as illustrated in FIG. 2A. The first source/drain region 107a may be disposed in the active region 103 between the pair of gate electrodes. The pair of gate electrodes and the first source/drain region 107a may be disposed between the pair of second source/drain regions 107b.

Lower surfaces of the source/drain regions 107a and 107b may be positioned at a predetermined depth from an upper surface of the active region 103. The source/drain regions 107a and 107b may be in contact with the sidewalls of the trench 105. The source/drain regions 107a and 107b may include a region doped with impurities. For example, the impurities may include phosphorous (P) or boron (B). According to some embodiments, the lower surfaces of the source/drain regions 107a and 107b may be higher than the bottom surface of the trench 105.

A gate dielectric 110 may be disposed between the liner electrode 125 and the inner surfaces (e.g., opposing sidewalls) of the trench 105. The gate dielectric 110 may include at least one of oxide, nitride, oxynitride, and a high-k material. The high-k material may be an insulating material having a dielectric constant higher than that of nitride. For example, the high-k material may include at least one of insulating metal oxides such as hafnium oxide and aluminum oxide. According to some embodiments, the gate dielectric 110 may be substantially U-shaped to contact substantially the entire inner surfaces of the trench 105.

According to some embodiments, as illustrated in FIG. 2C, because the top surface of the sidewall portion 125b of the liner electrode 125 is lower (e.g., closer to the bottom portion 125a) than the top surface of the bulk electrode 135, a height H1 of an overlapping region between the sidewall portions 125b of the liner electrode 125 and the source/drain regions 107a and 107b may be smaller than a height H2 of an overlapping region between the bulk electrode 135 and the source/drain regions 107a and 107b. As a result, an overlapping area/region between the liner electrode 125 and the source/drain regions 107a and 107b may be decreased (e.g., may be relatively small). Therefore, it may be possible to reduce/minimize gate-induced drain leakage current in the source/drain regions 107a and 107b caused by the liner electrode 125.

Referring to FIGS. 1 and 2A-2C, a capping pattern 140 may be disposed on the bulk electrode 135 and the liner electrode 125. The capping pattern 140 may fill a portion of the trench 105. The capping pattern 140 may include an insulating material. For example, the capping pattern 140 may include at least one of oxide, nitride, and oxynitride.

Referring to FIGS. 2A and 2B, a first interlayer dielectric 150 may be disposed on the substrate 100. Referring to FIG. 2A, a first contact plug 155 may be disposed penetrating the first interlayer dielectric 150. As illustrated in FIGS. 2A and 2C, the first contact plug 155 may be disposed to contact the first source/drain region 107a disposed adjacent the trench 105.

Referring to FIGS. 1, 2A, and 2B, a bit line 157, which is electrically connected to the first contact plug 155, may be disposed on the first interlayer dielectric 150. The bit line 157 may have a linear configuration extending in a direction that crosses a direction in which the trench 105 extends when viewed from the top. The bit line 157 may include a conductive material. For example, the bit line 157 may include at least one of a semiconductor material (e.g., polysilicon), a metal-semiconductor compound (e.g., tungsten silicide), conductive metal nitride (e.g., titanium nitride, tantalum nitride, or tungsten nitride, etc.), and metal (e.g., titanium, tungsten, or tantalum, etc.).

Referring to FIGS. 2A and 2B, a second interlayer dielectric 160 covering the bit line 157 may be disposed on the first interlayer dielectric 150. The first interlayer dielectric 150 and the second interlayer dielectric 160 may be single-layered or multi-layered. The first interlayer dielectric 150 and the second interlayer dielectric 160 may include at least one of oxide, nitride, and oxynitride.

Referring to FIGS. 1, 2A, and 2C, a second contact plug 170 may penetrate the first interlayer dielectric 150 and the second interlayer dielectric 160. The second contact plug 170 may be in contact with the second source/drain regions 107b disposed adjacent the trench 105.

The first contact plug 155 and the second contact plug 170 may include a conductive material. For example, the first contact plug 155 and the second contact plug 170 may include at least one of a semiconductor material (e.g., polysilicon), a metal-semiconductor compound (e.g., tungsten silicide), a conductive metal nitride (e.g., titanium nitride, tantalum nitride, or tungsten nitride, etc.), and a metal (e.g., titanium, tungsten, or tantalum, etc.).

According to some embodiments, because the top surface of the sidewall portion 125b of the liner electrode 125 is lower (e.g., closer to the bottom portion 125a) than the top surface of the bulk electrode 135, as illustrated in FIG. 2C, a recess region may be formed between the sidewall of the bulk electrode 135 and the gate dielectric 110. Accordingly, the distance from the bottom surfaces of the first and second contact plugs 155 and 170 (which may contact the source/drain regions 107a and 107b) to the top surfaces of the respective sidewall portions 125b of the liner electrode 125 may increase (e.g., may be relatively large). Therefore, short defects may be reduced/minimized between the liner electrode 125 and the first contact plug 155, and between the liner electrode 125 and the second contact plug 170.

Referring to FIGS. 1 and 2A, an information storage element 200, which may be physically and electrically connected to the second contact plug 170, may be disposed on the second interlayer dielectric 160. The information storage element 200 may be embodied in various forms (e.g., various shapes and materials, etc.).

Figure 3A:
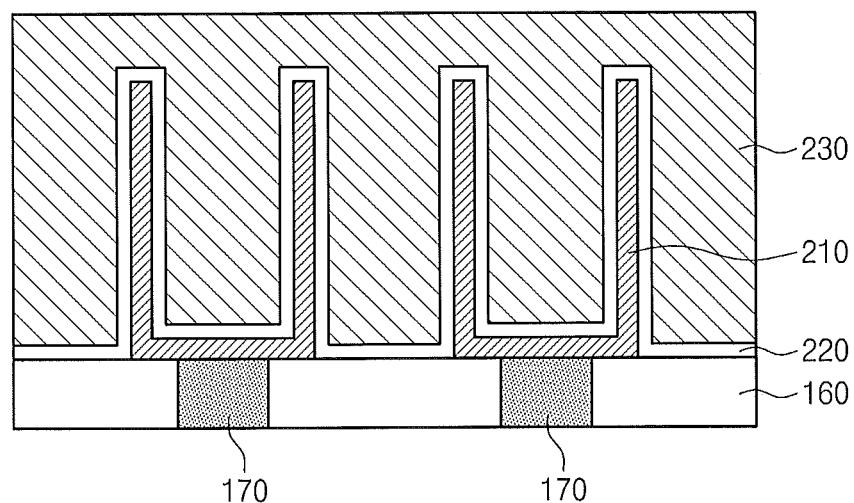
FIGS. 3A and 3B are enlarged views of the portion 'B' in FIG. 2A.
Figure 3B:
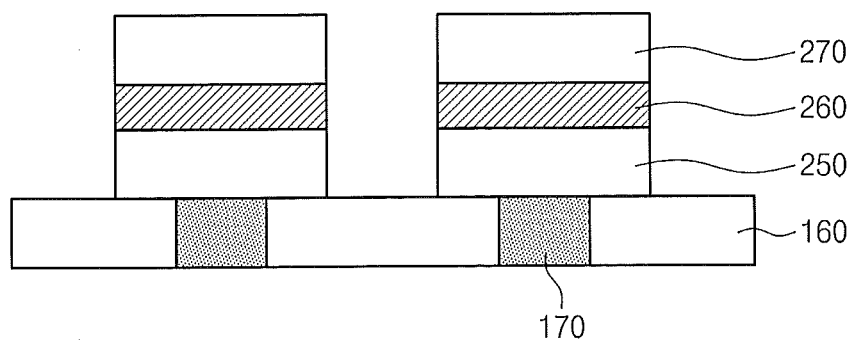

FIGS. 3A and 3B are enlarged views of the portion 'B' that is illustrated in FIG. 2A. FIGS. 3A and 3B are cross-sectional views illustrating some embodiments of the information storage element 200.

Referring to FIG. 3A, the information storage element 200 according to some embodiments may be a capacitor. The information storage element 200 may include a storage node 210 in contact with the second contact plug 170. The storage node 210 may have a cylinder shape. That is, the storage node 210 may include a substantially flat portion in contact with the second contact plug 170 and side portions extending upward from edges of the substantially flat portion. The storage node 210 may include a conductive material. For example, the storage node 210 may include at least one of doped semiconductor, conductive metal nitride (e.g., titanium nitride, tantalum nitride, or tungsten nitride, etc.), metal (e.g., ruthenium, iridium, titanium, or tantalum, etc.), and conductive metal oxide (e.g., iridium oxide, etc.).

A capacitor dielectric layer 220 may be conformally formed/disposed on a surface of the storage node 210. The capacitor dielectric layer 220 may cover substantially the entire surface of the storage node 210. Also, the capacitor dielectric layer 220 may cover a portion of the top surface of the second interlayer dielectric 160. The capacitor dielectric layer 220 may include at least one of oxide, nitride, oxynitride, and a high-k material.

An upper electrode 230 covering the capacitor dielectric layer 220 may be disposed on the second interlayer dielectric 160. The upper electrode 230 may include a conductive material. For example, the upper electrode 230 may include at least one of doped semiconductor, metal, conductive metal nitride, and metal silicide.

Referring to FIG. 3B, the information storage element 200 may include a variable resistor. The information storage element 200 may include a first electrode 250, a variable resistor 260, and a second electrode 270. The variable resistor 260 may be disposed between the first electrode 250 and the second electrode 270. Therefore, the first electrode 250, variable resistor 260, and second electrode 270 may have a sequentially-stacked configuration.

According to some embodiments, the variable resistor 260 may include a phase change material. The phase change material may be a compound including at least one of chalogenide elements, such as tellurium (Te) and selenium (Se), and also including at least one of germanium (Ge), antimony (Sb), bismuth (Bi), lead (Pb), tin (Sn), silver (Ag), arsenic (As), sulfur (S), silicon (Si), phosphorus (P), oxygen (O), and nitrogen (N). For example, the variable resistor 260 may include at least one of Ge—Sb—Te, As—Sb—Te, As—Ge—Sb—Te, Sn—Sb—Te, Ag-indium (In)—Sb—Te, In—Sb—Te, a group VA element-Sb—Te, a group VIA (e.g., group 6) element-Sb—Te, a group VA element-Sb—Se, and a group VIA element-Sb—Se.

The first electrode 250 and the second electrode 270 may include a conductive material having low reactivity. For example, the first electrode 250 and the second electrode 270 may include a conductive metal nitride (e.g., titanium nitride, tantalum nitride and/or titanium-aluminum nitride, etc.). According to some embodiments, the first electrode 250 may be a heater electrode. As such, the first electrode 250 may apply heat to the variable resistor 260 such that the variable resistor may be changed to a non-crystalline state or a crystalline state. Accordingly, the information storage element 200 may store information using a resistivity difference between the non-crystalline state and the crystalline state of the variable resistor 260.

The information storage element 200 may further include an ohmic layer disposed between the second contact plug 170 and the first electrode 250. For example, the ohmic layer may include at least one of a cobalt semiconductor compound (e.g., cobalt silicide, etc.), a nickel semiconductor compound (e.g., nickel silicide, etc.), and a titanium semiconductor compound (e.g., titanium silicide, etc.).

Alternatively, the variable resistor 260 may include a transition metal oxide. For example, the variable resistor 260 may include one of nickel (Ni), niobium (Nb), titanium (Ti), zirconium (Zr), hafnium (Hf), cobalt (Co), iron (Fe), copper (Cu), chromium (Cr), and compounds thereof.

In some embodiments, the first electrode 250 and the second electrode 270 may include a conductive material. For example, the first electrode 250 and the second electrode 270 may include at least one of aluminum (Al), gold (Au), platinum (Pt), ruthenium (Ru), iridium (Ir), and titanium (Ti).

According to some embodiments, the information storage element 200 may store information using resistance changes in the variable resistor 260 according to voltages applied to the first electrode 250 and the second electrode 270.

As another example, the variable resistor 260 may be a magnetic tunnel junction (MTJ) pattern. As such, the variable resistor 260 may include a free layer, a reference layer, and a tunnel barrier disposed between the free layer and the reference layer. The magnetization direction of the free layer may be changed, and the reference layer may have a fixed magnetization direction.

Figure 4A:
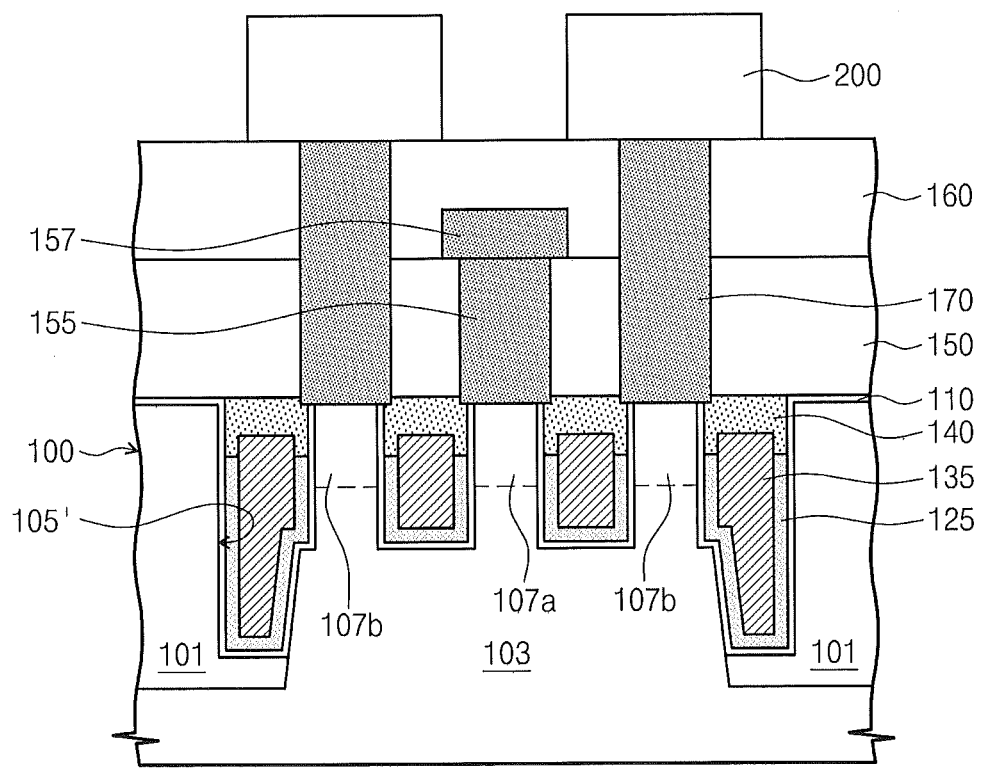
FIG. 4A is a cross-sectional view taken along the line I-I' of FIG. 1 illustrating a semiconductor device according to some embodiments.
Figure 4B:
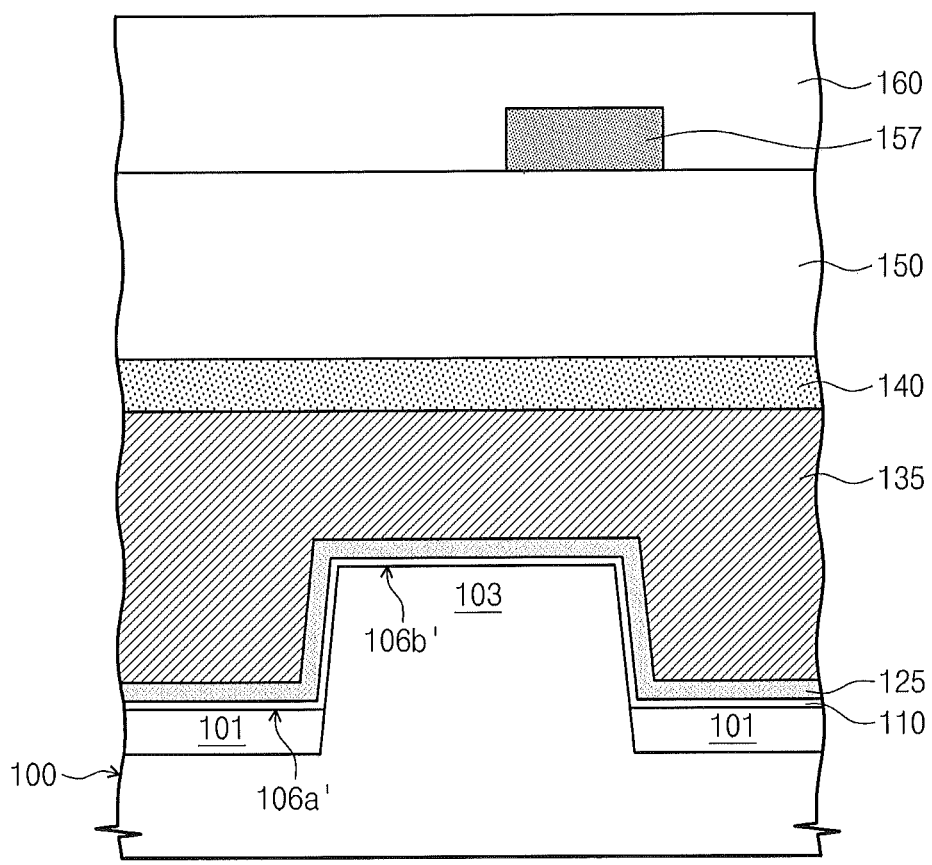
FIG. 4B is a cross-sectional view taken along the line II-II' of FIG. 1 illustrating a semiconductor device according to some embodiments.

FIG. 4A is a cross-sectional view taken along the line of FIG. 1 illustrating some embodiments of the inventive concept, and FIG. 4B is a cross-sectional view taken along the line II-II' of FIG. 1 illustrating some embodiments of the inventive concept. Descriptions relating to identical/substantially-identical configurations that have already been described herein may not be repeated.

Referring to FIGS. 4A and 4B, a trench 105', which extends in one direction, and crosses over/into the active region 103 and the device isolation layer 101 when viewed from the top, may be disposed in the substrate 100. As illustrated in FIG. 4B, the trench 105' may include a first bottom surface 106' and a second bottom surface 106b'. The first bottom surface 106a' may be disposed in/on the device isolation layer 101. The second bottom surface 106b' may be disposed in/on the active region 103. According to some embodiments, the first bottom surface 106a' may be positioned at a level lower (e.g., farther from the information storage element 200) than the second bottom surface 106b'. Therefore, the trench 105' may include a recess region defined by a portion of sidewall of the active region 103 and the first bottom surface 106a' of the trench 105'.

A bulk electrode 135 may be disposed in the trench 105'. The bulk electrode 135 may be disposed to substantially fill the recess region in the trench 105'. Therefore, the cross-sectional area of the bulk electrode 135 may be wider in/on the device isolation layer 101 than in/on the active region 103.

Also, a top surface of the bulk electrode 135 may be lower (e.g., farther from the information storage element 200) than a top surface of the substrate 100. Therefore, the bulk electrode 135 may have a buried configuration in the trench 105'.

A liner electrode 125 may be disposed between the bulk electrode 135 and inner surfaces of the trench 105'. As previously described with respect to FIG. 2C, the liner electrode 125 may include a bottom portion disposed between the bulk electrode 135 and the first and second bottom surfaces 106a' and 106b' of the trench 105', and a pair of sidewall portions extending upward from both ends of the bottom portion. Each sidewall portion of the liner electrode may be disposed between the bulk electrode 135 and one sidewall of the trench 105'. A top surface of the sidewall portion of the liner electrode 125 may be lower (e.g., farther from the information storage element 200) than the top surface of the bulk electrode 135. Therefore, the bulk electrode 135 may include a portion that protrudes beyond the top surface of the sidewall of the liner electrode 125.

The bottom portion of the liner electrode 125 may be conformally formed/disposed along the first bottom surface 106a' and the second bottom surface 106b' of the trench 105', and along a portion of sidewalls of the active region 103. Therefore, the bottom portion of the liner electrode 125 may have a curved shape.

As previously described with respect to FIGS. 2A-2C, the bulk electrode 135 and the liner electrode 125 may include the same (or substantially the same) material.

The liner electrode 125 may function as a barrier for the bulk electrode 135. Also, the liner electrode 125 may function to control the effective work function of the bulk electrode 135.

A gate dielectric 110 may be disposed between the liner electrode 125 and inner surfaces of the trench 105'.

Referring to FIG. 4A, according to some embodiments, because the top surface of the sidewall portion of the liner electrode 125 is lower (e.g., farther from the information storage element 200) than the top surface of the bulk electrode 135, an overlapping area between the liner electrode 125 and the source/drain regions 107a and 107b may be decreased (e.g., may be relatively small). Therefore, gate-induced drain leakage current in the source/drain regions 107a and 107b caused by the liner electrode 125 may be reduced/minimized.

Also, because the top surface of the sidewall portion of the liner electrode 125 is lower (e.g., farther from the information storage element 200) than the top surface of the bulk electrode 135, short defects may be reduced/minimized between the liner electrode 125 and the first contact plug 155, and between the liner electrode 125 and the second contact plug 170.

In addition, according to some embodiments, the active region 103 may function as a fin. Therefore, a channel width of the semiconductor device according to the inventive concept may be increased (e.g., may be relatively large) and electrical characteristics may be improved.

FIGS. 5 through 18 are cross-sectional views illustrating a method of forming a semiconductor device according to some embodiments of the inventive concept.

Figure 5:
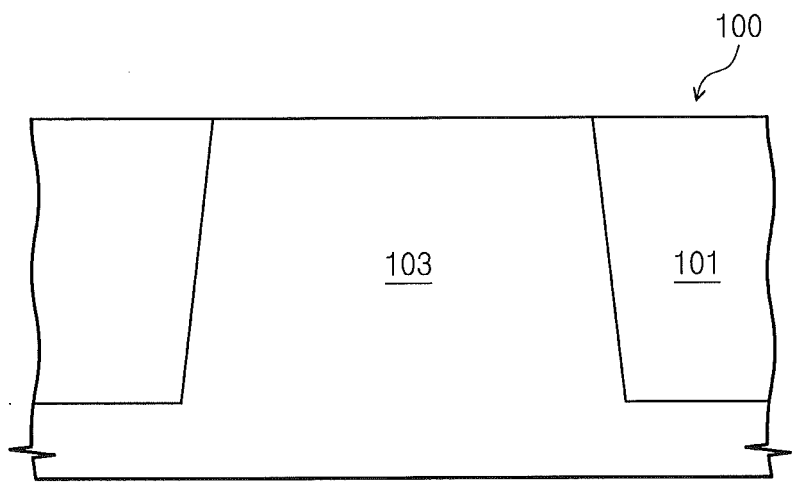
FIGS. 5 through 18 are cross-sectional views illustrating a method of forming a semiconductor device according to some embodiments.

Referring to FIG. 5, a substrate 100, which includes an active region 103 and a device isolation layer 101 defining the active region 103, is prepared. The substrate 100 may include a semiconductor material. For example, the substrate 100 may include at least one of silicon and germanium.

The device isolation layer 101 may be formed by forming a groove in the substrate 100, forming an insulation layer filling the groove on an entire surface of the substrate 100, and etching the insulation layer to expose a top surface of the substrate 100. The device isolation layer 101 may include an insulating material. For example, the device isolation layer 101 may include at least one of oxide, nitride, and oxynitride.

Figure 6:
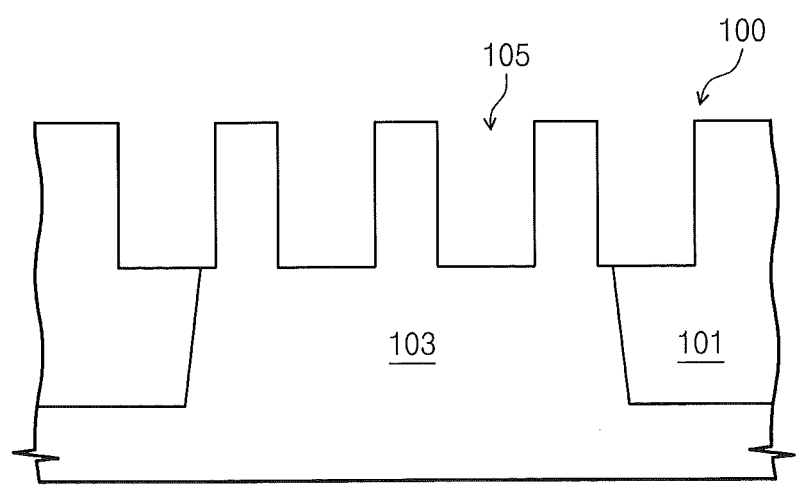

Referring to FIG. 6, a trench 105 may be formed in the substrate 100. The trench 105 may be formed in the shape of a line extending in one direction, and crossing over/into the active region 103 and the device isolation layer 101 when viewed from the top. According to some embodiments, a pair of trenches 105 may cross over/into the active region 103.

The trench 105 may be formed by forming a mask pattern on the substrate 100 and etching using the mask pattern as an etching mask. The etching process may include a dry etching process.

Figure 7:
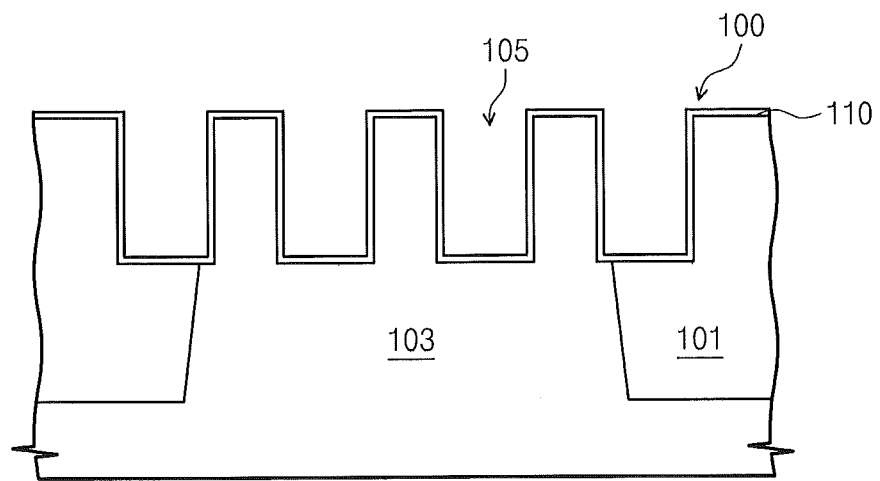

Referring to FIG. 7, a gate dielectric 110 may be conformally formed on the top surface of the substrate 100 and on inner surfaces (e.g., opposing sidewalls) of the trench 105. The gate dielectric 110 may be formed by an oxidation process. The oxidation process may be performed one or more times. In other words, the gate dielectric 110 may be formed by performing the oxidation process once, or by repeatedly performing the oxidation process multiple times.

Alternatively, the gate dielectric 110 may be formed by a chemical vapor deposition (CVD) process or an atomic layer deposition (ALD) process. The gate dielectric 110 may include at least one of a high-k material, oxide, nitride, and oxynitride. The high-k material may be an insulating material having a dielectric constant higher than that of nitride. For example, the high-k material may include at least one of insulating metal oxides such as hafnium oxide and aluminum oxide.

Figure 8:
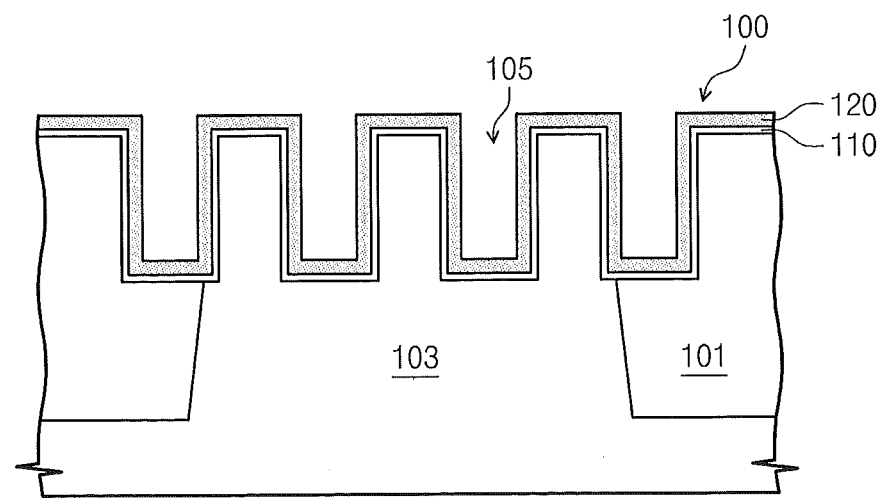

Referring to FIG. 8, a liner electrode layer 120 may be conformally formed on the top surface of the substrate 100 and the inner surfaces (e.g., opposing sidewalls) of the trench 105. The liner electrode layer 120 may be formed by a physical vapor deposition (PVD) process, a chemical vapor deposition process, or an atomic layer deposition process. The liner electrode layer 120 may include at least one of doped-semiconductor, conductive metal nitride (e.g., titanium nitride, tantalum nitride, or tungsten nitride, etc.), and metal (e.g., ruthenium, iridium, titanium, tungsten, or tantalum, etc.). In some embodiments, the liner electrode layer 120 may be formed on the gate dielectric 110.

Figure 9:
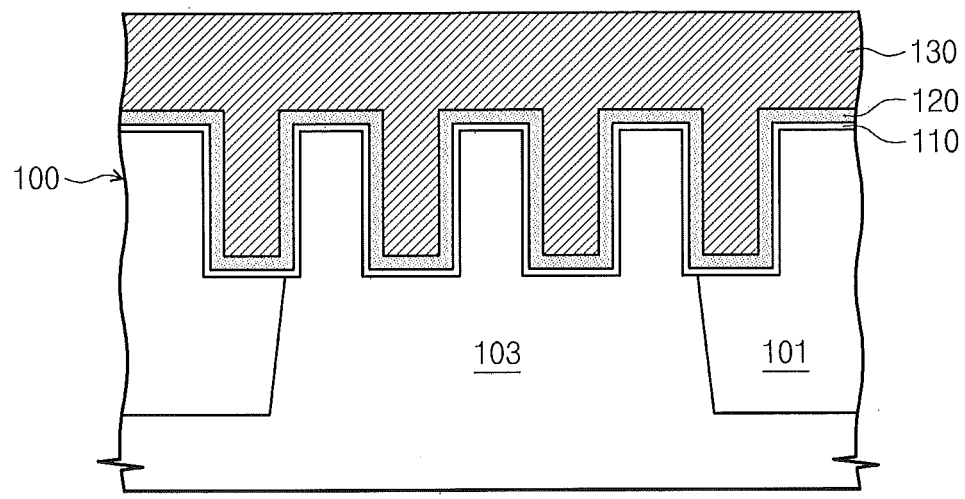

Referring to FIG. 9, a bulk electrode layer 130 substantially filling the inside of the trench 105 may be formed on substantially the entire surface of the substrate 100. The bulk electrode layer 130 may be formed by a physical vapor deposition process, a chemical vapor deposition process, or an atomic layer deposition process. The bulk electrode layer 130 may include at least one of doped-semiconductor, conductive metal nitride (e.g., titanium nitride, tantalum nitride, or tungsten nitride, etc.), and metal (e.g., ruthenium, iridium, titanium, tungsten, or tantalum, etc.).

In some embodiments, the bulk electrode layer 130 may be formed on the liner electrode layer 120. Before forming the liner electrode layer 120, a surface treatment process such as nitridation and ozonization treatment may be performed on the substrate 100 in/on which the gate dielectric 110 is formed. Using this surface treatment process, the reliability and electrical characteristics of a semiconductor device may be improved by reducing/minimizing the generation of layers due to foreign substances at the interface between the gate dielectric 110 and the liner electrode layer 120.

Figure 10:
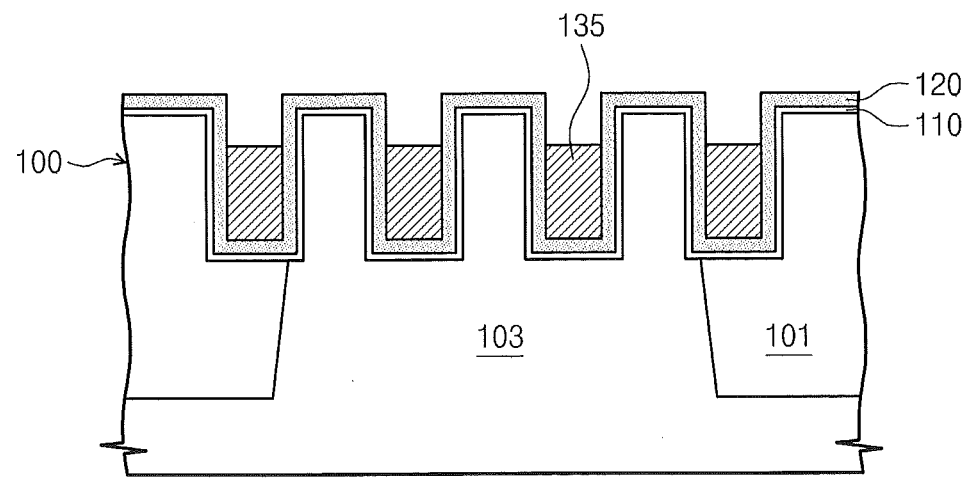

Referring to FIG. 10, a bulk electrode 135 may be formed by etching the bulk electrode layer 130. The liner electrode layer 120 formed on the top surface of the substrate 100 may be exposed by the etching process. A top surface of the bulk electrode 135 may be formed lower (e.g., deeper within the trench 105) than the top surface of the substrate 100. Therefore, the bulk electrode 135 may be formed/recessed within the trench 105. The bulk electrode 135 may be formed by at least one of a dry etching process and a chemical mechanical polishing (CMP) process.

Figure 11:
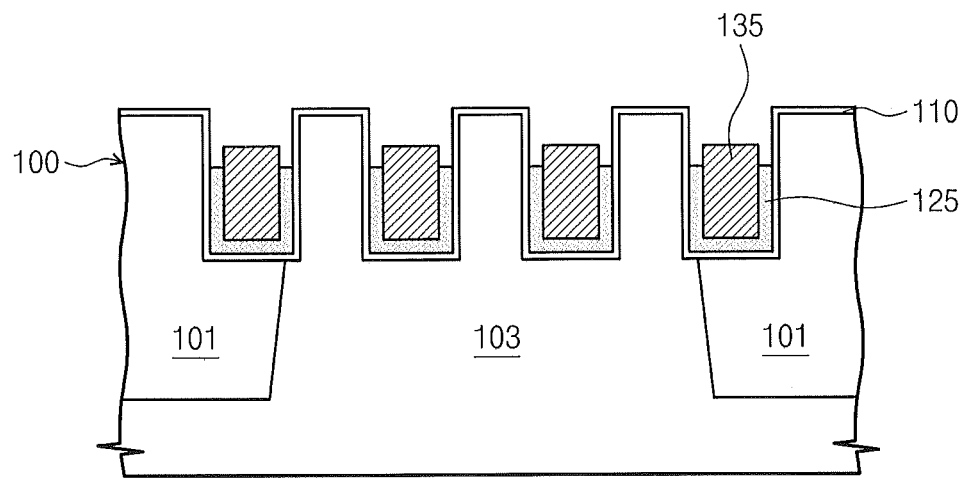

Referring to FIG. 11, a liner electrode 125 may be formed by etching the liner electrode layer 120.

As illustrated in the previously-described FIG. 2C, the liner electrode 125 may be formed to include a bottom portion 125a disposed between the bulk electrode 135 and a bottom surface of the trench 105, and a pair of sidewall portions 125b extending upward (e.g., along opposing sidewalls of the trench 105) from respective ends of the bottom portion 125a. Each sidewall portion 125b may be disposed between the bulk electrode 135 and one sidewall of the trench 105. According to some embodiments, the liner electrode 125 may be formed to have a U-shaped cross-section covering sidewalls and a bottom surface of the bulk electrode 135.

The liner electrode 125 and the bulk electrode 135 formed in the trench 105 may be included in a gate electrode. According to some embodiments, a pair of trenches 105 crosses over/into the active region 103 such that a pair of gate electrodes including the liner electrode 125 and the bulk electrode 135 may cross over/into the active region 103.

The liner electrode 125 may be formed by etching the liner electrode layer 120 until a top surface of the sidewall portion 125b of the liner electrode 125 is formed lower (e.g., deeper within the trench 105) than the top surface of the bulk electrode 135. In other words, the liner electrode layer 120 may be etched to form recess regions between the sidewalls of the trench 105 and the sidewalls of the bulk electrode 135. The liner electrode 125 may be formed by at least one of a dry etching process and a chemical mechanical polishing process.

According to some embodiments, the liner electrode layer 120 may include a material having a resistivity higher than that of the bulk electrode layer 130. In some embodiments, the liner electrode layer 120 and the bulk electrode layer 130 may include materials having different etch selectivities. For example, the liner electrode layer 120 may include titanium nitride, and the bulk electrode layer 130 may include tungsten.

As described with reference to FIG. 9, the liner electrode layer 120 and the bulk electrode layer 130 may be formed on the substrate 100. In particular, the liner electrode layer 120 and the bulk electrode layer 130 may be formed on the substrate 100 by a variety of different methods.

Referring again to FIG. 11, the liner electrode 125 and the bulk electrode 135 may be formed through substantially the same etching process. In some embodiments, the liner electrode layer 120 and the bulk electrode layer 130 may include materials containing the same element. Also, the liner electrode layer 120 may include a PVD-conductive material, and the bulk electrode layer 130 may include a CVD-conductive material. For example, the liner electrode layer 120 may include titanium nitride formed by a physical vapor deposition process, and the bulk electrode layer 130 may include a titanium nitride formed by a chemical vapor deposition process.

According to some embodiments, the liner electrode layer 120 may have etching rate that is faster than the bulk electrode layer 130 under substantially the same etching conditions. Therefore, the liner electrode layer 120 may be etched faster during a given process time such that recess regions may be formed between the sidewalls of the trench 105 and the sidewalls of the bulk electrode 135. As a result, the top surfaces of the liner electrode 125 formed between the sidewalls of the trench 105 and the sidewalls of the bulk electrode 135 may be formed lower (e.g., deeper within the trench 105) than the top surface of the bulk electrode 135.

Figure 12:
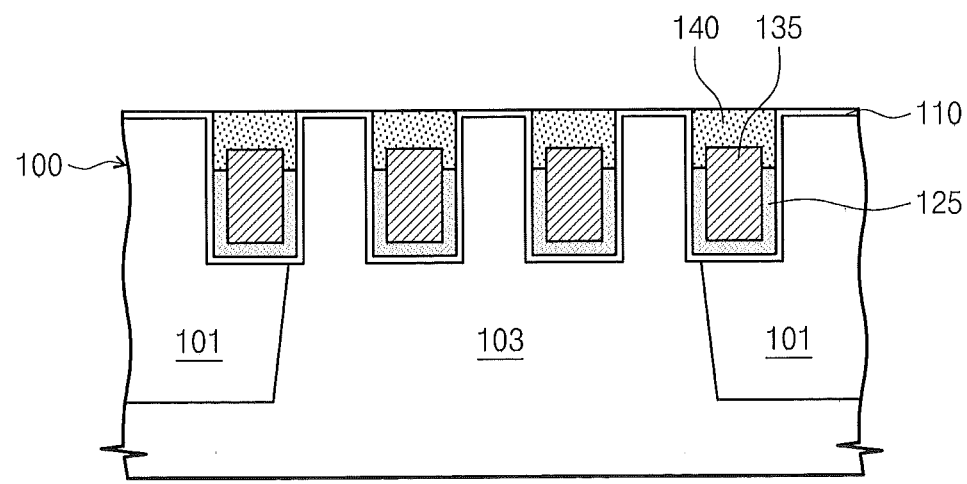

Referring to FIG. 12, a capping pattern 140 may be formed on the bulk electrode 135 and the liner electrode 125. The capping pattern 140 may be formed by forming a capping layer on substantially the entire surface of the substrate 100 and etching the capping layer until the gate dielectric 110 formed on the top surface of the substrate 100 is exposed. The capping layer may be formed by a chemical vapor deposition process. The etching process may be performed by at least one of a chemical mechanical polishing process, a dry etching process, and a wet etching process. The capping pattern 140 may include an insulating material. For example, the capping pattern 140 may include at least one of oxide, nitride, and oxynitride.

According to some embodiments, an insulation layer may be disposed between the capping pattern 140 and the bulk electrode 135, and between the capping pattern 140 and the liner electrode 125.

Figure 13:
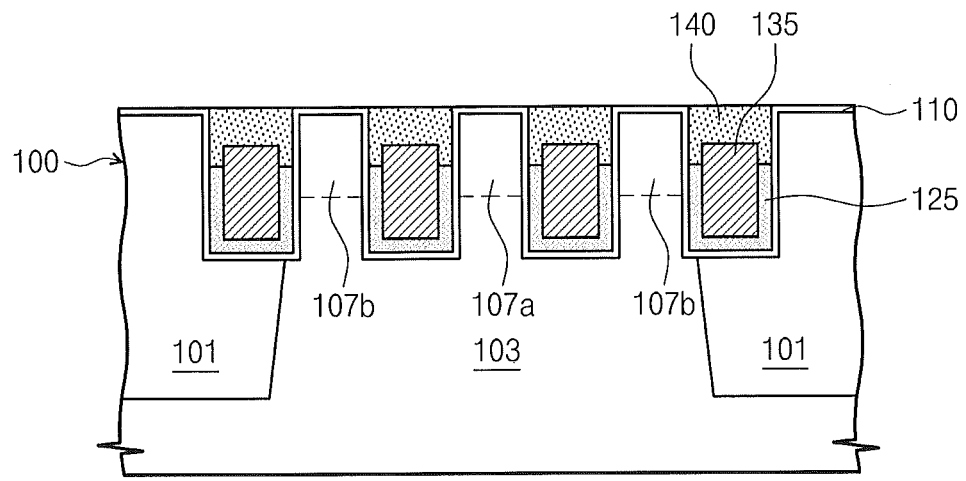

Referring to FIG. 13, source/drain regions 107a and 107b adjacent the trench 105 may be formed in the active region 103 at both sides (e.g., adjacent opposing sidewalls) of the trench 105. According to some embodiments, a first source/drain region 107a and a pair of second source/drain regions 107b may be formed in the active region 103. The first source/drain region 107a may be formed in the active region 103 between the pair of gate electrodes. The pair of gate electrodes and the first source/drain region 107a may be formed to be disposed between the pair of second source/drain regions 107b.

Bottom surfaces of the source/drain regions 107a and 107b may be formed at a predetermined depth from a top surface of the active region 103. The source/drain regions 107a and 107b may be in contact with sidewalls of the trench 105. The source/drain regions 107a and 107b may be formed by implanting impurities into the active region 103. For example, the impurities may include phosphorous (P) or boron (B). According to some embodiments, the bottom surfaces of the source/drain regions 107a and 107b may be higher (e.g., closer to the top surface of the bulk electrode 135) than the bottom surface of the trench 105.

Figure 14:
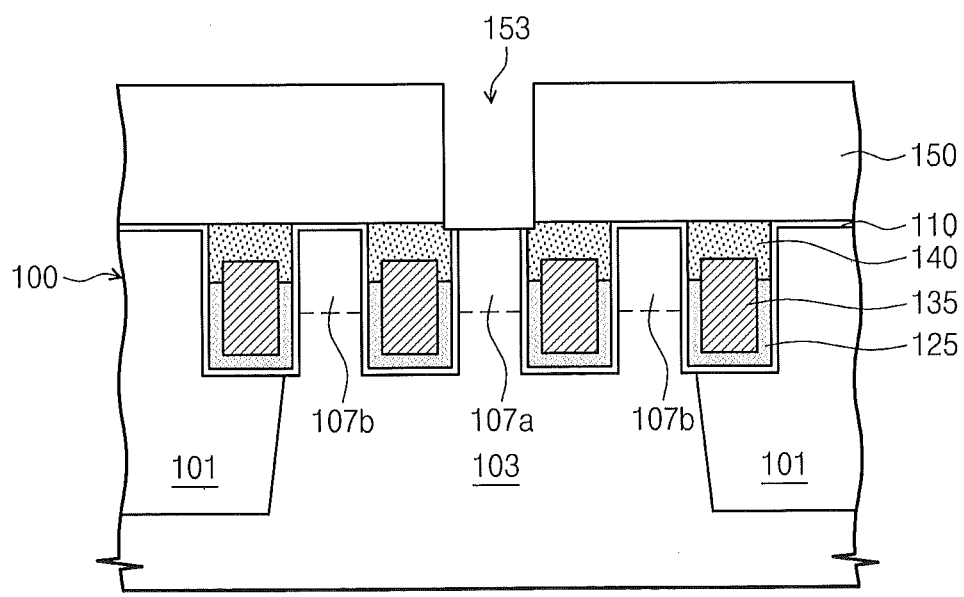

Referring to FIG. 14, a first interlayer dielectric 150 may be formed on the substrate 100. The first interlayer dielectric 150 may include at least one of oxide, nitride, and oxynitride.

A first through-hole 153 may be formed to penetrate the first interlayer dielectric 150 to expose a top surface of the first source/drain region 107a. The first through-hole 153 may be formed by forming a mask pattern on the first interlayer dielectric 150 and performing a dry etching process on the first interlayer dielectric 150 using the mask pattern.

Figure 15:
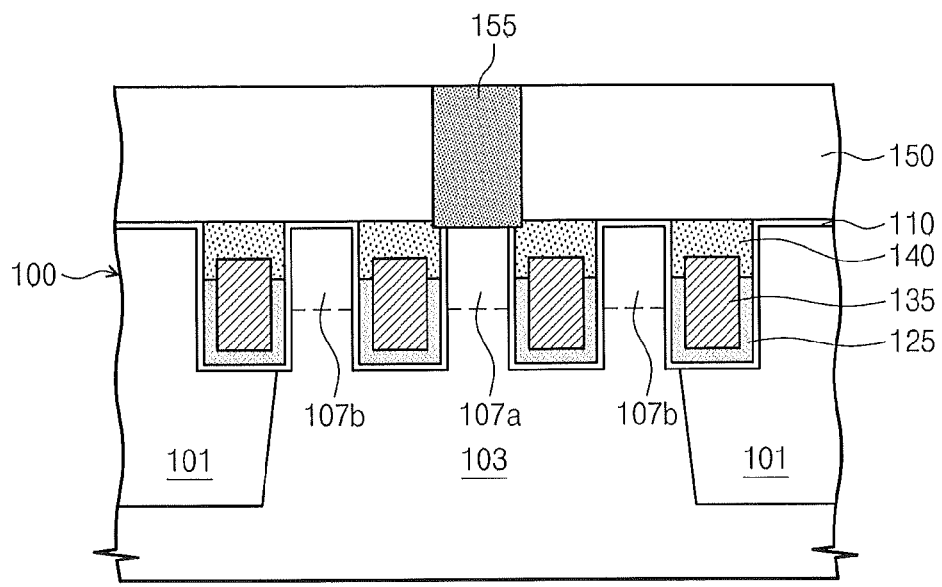

Referring to FIG. 15, a first contact plug 155 may be formed in the first through-hole 153. The first contact plug 155 may include a conductive material. For example, the first contact plug 155 may include at least one of a semiconductor material (e.g., polysilicon), a metal-semiconductor compound (e.g., tungsten silicide), conductive metal nitride (e.g., titanium nitride, tantalum nitride, or tungsten nitride, etc.), and metal (e.g., titanium, tungsten, or tantalum, etc.).

The first contact plug 155 may be formed by forming a conductive layer filling the first through-hole 153 on the first interlayer dielectric 150 and etching the conductive layer until a top surface of the first interlayer dielectric 150 is exposed. The conductive layer may be formed using a chemical vapor deposition process or a physical vapor deposition process. The etching process may be performed by at least one of a dry etching process and a chemical mechanical polishing process.

Figure 16:
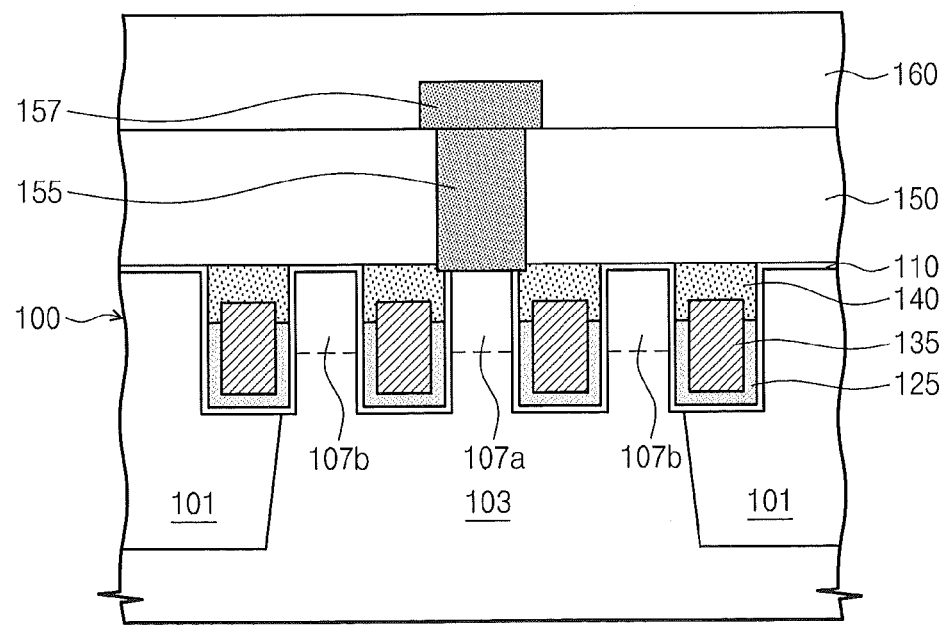

Referring to FIG. 16, a bit line 157, which is electrically connected to the first contact plug 155, may be formed on the first interlayer dielectric 150. The bit line 157 may be formed in a line-type configuration that extends in a direction crossing a direction in which the trench 105 extends when viewed from the top. The bit line 157 may include a conductive material. For example, the bit line 157 may include at least one of a semiconductor material (e.g., polysilicon), a metal-semiconductor compound (e.g., tungsten silicide), conductive metal nitride (e.g., titanium nitride, tantalum nitride, or tungsten nitride, etc.), and metal (e.g., titanium, tungsten, or tantalum, etc.).

The bit line 157 may be formed by forming a conductive layer on the first interlayer dielectric 150 and patterning the conductive layer. Alternatively, the bit line 157 may be formed by a damascene process. For example, the bit line 157 may be formed by forming an insulation layer including an opening on the first interlayer dielectric 150 and filling the opening with a conductive material.

Referring still to FIG. 16, a second interlayer dielectric 160 covering the bit line 157 may be formed on the first interlayer dielectric 150. The second interlayer dielectric 160 may be formed by a chemical vapor deposition process. The second interlayer dielectric 160 may include at least one of oxide, nitride, and oxynitride.

Figure 17:
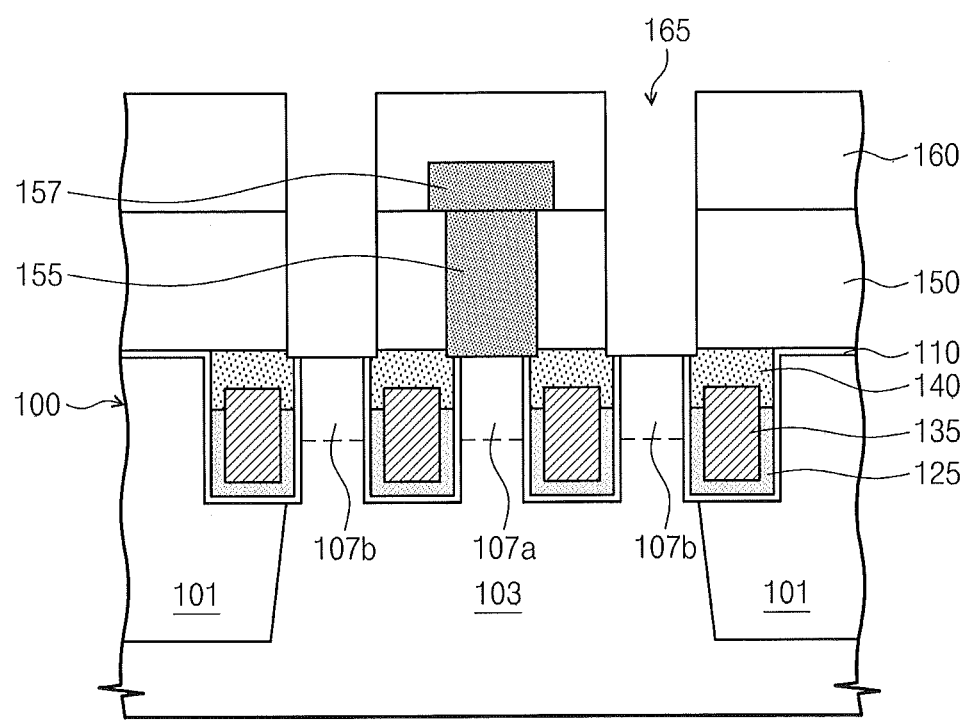

Referring to FIG. 17, second through-holes 165 may be formed to penetrate the first interlayer dielectric 150 and the second interlayer dielectric 160 to expose a top surface the second source/drain regions 107b. The second through-holes 165 may be formed by forming a mask pattern on the second interlayer dielectric 160, and performing a dry etching process on the first interlayer dielectric 150 and the second interlayer dielectric 160 using the mask pattern.

Figure 18:
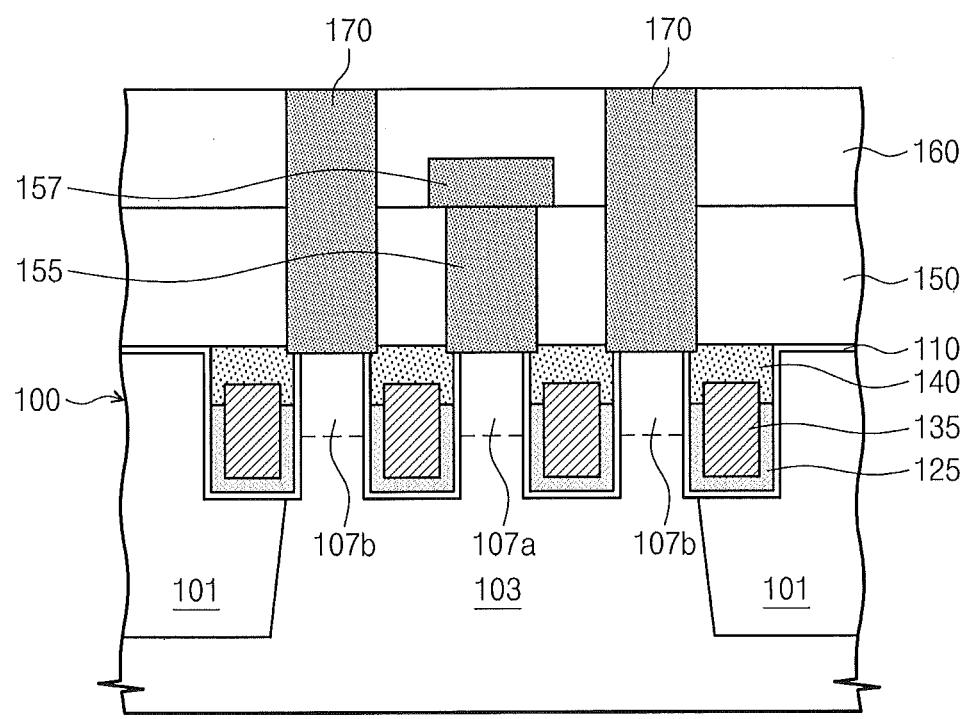

Referring to FIG. 18, second contact plug 170 may be formed in the second through-hole 165. The second contact plug 170 may include a conductive material. For example, the second contact plug 170 may include at least one of a semiconductor material (e.g., polysilicon), a metal-semiconductor compound (e.g., tungsten silicide), conductive metal nitride (e.g., titanium nitride, tantalum nitride, or tungsten nitride, etc.), and metal (e.g., titanium, tungsten, or tantalum, etc.).

The second contact plug 170 may be formed by forming a conductive layer filling the second through-hole 165 on the second interlayer dielectric 160 and etching the conductive layer until a top surface of the second interlayer dielectric 160 is exposed. The conductive layer may be formed by a chemical vapor deposition process or a physical vapor deposition process. The etching process may be performed by at least one of a dry etching process and a chemical mechanical polishing process.

Figure 19:
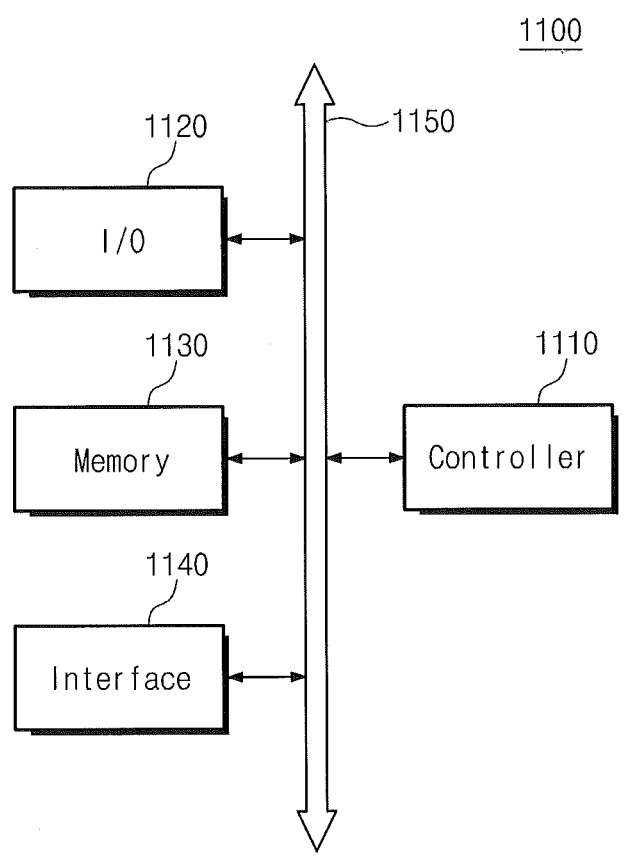
FIG. 19 is a block diagram schematically illustrating an example of a memory system including a semiconductor device according to some embodiments.

FIG. 19 is a block diagram illustrating an example of an electronic system including a semiconductor device that is based on the inventive concept.

Referring to FIG. 19, the electronic system 1100 according to some embodiments of the inventive concept may include a controller 1110, an input/output (I/O) device 1120, a memory device 1130, an interface 1140, and a bus 1150. The controller 1110, the input/output device 1120, the memory device 1130 and/or the interface 1140 may be interconnected to each other through the bus 1150. The bus 1150 corresponds to a data transfer path.

The controller 1110 may include at least one of a microprocessor, a digital signal processor, a micro-controller, and other logic devices capable of performing similar functions. The input/output device 1120 may include a key pad, a keyboard, and/or a display device, etc. The memory device 1130 may store data and/or commands, etc. The memory device 1130 may include at least one non-volatile memory device (e.g., a device described with respect to FIGS. 1-18). The memory device 1130 may further include another kind/type of memory device (e.g., another kind/type of non-volatile memory device and/or a static random access memory (SRAM) device, etc.). The interface 1140 may serve to transmit/receive data to/from a communication network. The interface 1140 may by a wired interface or a wireless interface. For example, the interface 1140 may include an antenna or wired/wireless transceivers, etc. Although not illustrated, the electronic system 1100, which may be a working memory device for improving an operation of the controller 1110, may further include a high-speed SRAM device, etc.

The electronic system 1100 may be applied to a personal digital assistant (PDA), a portable computer, a web tablet, a wireless phone, a mobile phone, a digital music player, a memory card, and various other electronic products that can transmit and/or receive data in a wireless environment.

Figure 20:
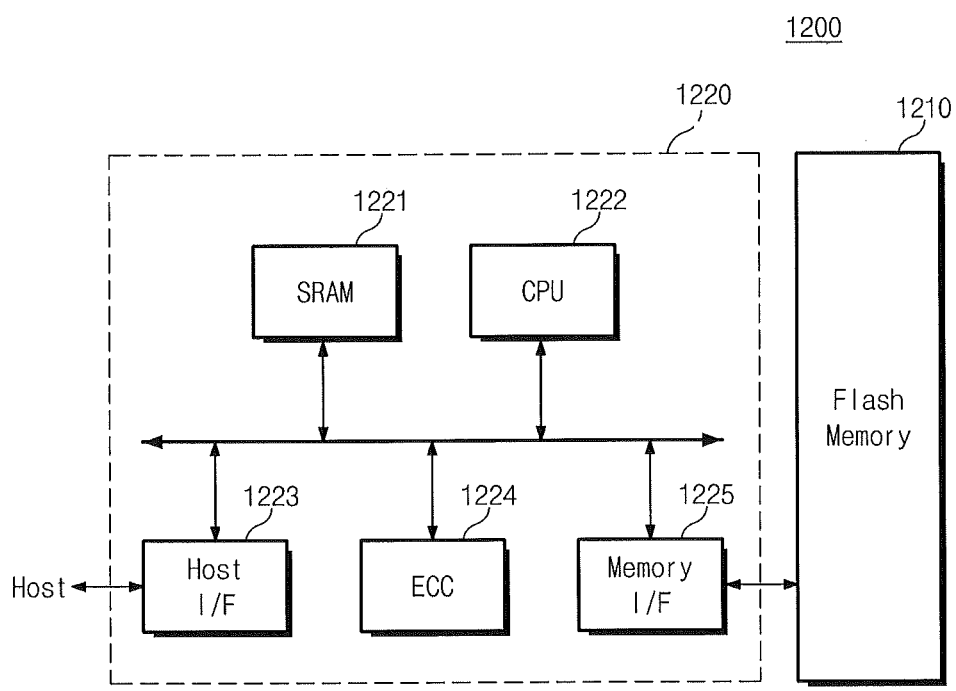
FIG. 20 is a block diagram schematically illustrating an example of a memory card including a semiconductor device according to some embodiments.

FIG. 20 is a block diagram illustrating an example of a memory card including a semiconductor device that is based on the inventive concept.

Referring to FIG. 20, the memory card 1200 according to some embodiments of the inventive concept includes a memory device 1210. The memory device 1210 may include at least one semiconductor device (e.g., a device described with respect to FIGS. 1-18). Also, the memory device 1210 may further include another kind/type of memory device (e.g., another kind/type of non-volatile memory device and/or a SRAM device, etc.). The memory card 1200 may include a memory controller 1220 that controls various data exchanges between a host and the memory device 1210.

The memory controller 1220 may include a processing unit 1222 (e.g., a central processing unit (CPU)) that controls overall operations of the memory card 1200. Also, the memory controller 1220 may include a SRAM 1221 that may be used as a working memory of the processing unit 1222. In addition, the memory controller 1220 may further include a host interface (I/F) 1223 and a memory interface (I/F) 1225. The host interface 1223 may have a data exchange protocol between the memory card 1200 and the host. The memory interface 1225 may connect the memory controller 1220 with the memory device 1210. Furthermore, the memory controller 1220 may further include an error correction code (ECC) unit 1224. The error correction code unit 1224 may detect and correct an error in the data read out from the memory device 1210. Although not illustrated, the memory card 1200 may further include a read only memory (ROM) device that stores code data for interfacing with the host. In some embodiments, the memory card 1200 may be used as a portable data storage card. Alternatively, the memory card 1200 may be realized as a solid state disk (SSD), which may replace/supplement a hard disk of a computer system.

The semiconductor devices disclosed in the foregoing embodiments may be realized in various types of semiconductor packages. Examples of the packages of the semiconductor devices according to some embodiments of the inventive concept may include package on package (PoP), ball grid arrays (BGAs), chip scale packages (CSPs), a plastic leaded chip carrier (PLCC), a plastic dual in-line package (PDIP), a die in waffle pack, a die in wafer form, a chip on board (COB), a ceramic dual in-line package (CERDIP), a plastic metric quad flat pack (MQFP), a thin quad flat pack (TQFP), a small outline package (SOP), a shrink small outline package (SSOP), a thin small outline package (TSOP), a thin quad flat package (TQFP), a system in package (SIP), a multi chip package (MCP), a wafer-level fabricated package (WFP), a wafer-level processed package (WSP), and so on.

A package, on which a semiconductor device according to some embodiments of the inventive concept is mounted, may further include a controller and/or a logic device, or the like, that may control the semiconductor device.

According to some embodiments of the foregoing semiconductor devices, an overlapping region between a liner electrode and a source/drain region may be decreased (e.g., may be relatively small). Therefore, generation of gate-induced drain leakage current in the source/drain region by a gate electrode can be minimized/reduced.

In addition, a distance from the liner electrode to an adjacent contact plug may increase (e.g., may be relatively large) such that generation of electrical shorts between the liner electrode and the contact plugs can be minimized/reduced. Therefore, semiconductor devices having improved reliability and electrical characteristics may be provided.

While the inventive concept has been particularly shown and described with reference to various embodiments thereof, it will be understood by those of ordinary skill in the art that various changes in form and details may be made therein without departing from the spirit and scope of the inventive concept as defined by the following claims. Therefore, the above-disclosed subject matter is to be considered illustrative and not restrictive.

What is claimed is:

1. A semiconductor device comprising:
a trench in a substrate;
a bulk electrode within opposing sidewalls of the trench;
a liner electrode between the bulk electrode and the opposing sidewalls of the trench,
wherein the liner electrode comprises a sidewall portion between a sidewall of the bulk electrode and one of the opposing sidewalls of the trench, and
wherein a top surface of the bulk electrode is higher than a top surface of the sidewall portion of the liner electrode and lower than a top surface of the substrate;
a gate dielectric between the liner electrode and the opposing sidewalls of the trench; and
a source/drain region adjacent the trench such that the sidewall portion of the liner electrode overlaps a portion of a sidewall of the source/drain region.

2. The semiconductor device of claim 1, wherein the liner electrode further comprises a bottom portion between the bulk electrode and a bottom surface of the trench.

3. The semiconductor device of claim 1, wherein the liner electrode comprises a material having a resistivity higher than the bulk electrode.

4. The semiconductor device of claim 1, wherein the liner electrode and the bulk electrode comprise at least one of metal and conductive metal nitride.

5. The semiconductor device of claim 1, wherein the liner electrode and the bulk electrode comprise materials having different etch selectivities.

6. The semiconductor device of claim 5, wherein the liner electrode comprises titanium nitride, and the bulk electrode comprises tungsten.

7. The semiconductor device of claim 5:
wherein the liner electrode and the bulk electrode comprise materials including a common element,
wherein the liner electrode comprises a physical vapor deposition (PVD)-conductive material, and
wherein the bulk electrode comprises a chemical vapor deposition (CVD)-conductive material.

8. The semiconductor device of claim 7, wherein the liner electrode comprises PVD-titanium nitride, and the bulk electrode comprises CVD-titanium nitride.

9. The semiconductor device of claim 1, further comprising a capping pattern on the liner electrode and the bulk electrode within the opposing sidewalls of the trench.

10. A semiconductor device comprising:
a plurality of trenches spaced apart on a substrate, each trench among the plurality of trenches including:
a bulk electrode within opposing sidewalls of the trench;
a liner electrode between the bulk electrode and the opposing sidewalls of the trench such that a protruding portion of the bulk electrode protrudes beyond opposing sidewalls of the liner electrode; and
a capping pattern on the protruding portion of the bulk electrode within opposing sidewalls of the trench;
source/drain regions between the plurality of trenches such that portions of the opposing sidewalls of the liner electrode overlap sidewalls of the source/drain regions; and
contact plugs on the source/drain regions and on portions of the plurality of trenches.

11. The semiconductor device of claim 10, further comprising:
an interlayer dielectric layer on the capping pattern,
wherein the protruding portion of the bulk electrode is closer than the opposing sidewalls of the liner electrode to the interlayer dielectric layer.

12. The semiconductor device of claim 11:
wherein protruding portions of the contact plugs protrude into the trench to overlap the portions of the opposing sidewalls of the liner electrode,
wherein the opposing sidewalls of the liner electrode are closer to the protruding portions of the contact plugs than to interlayer dielectric layer, and
wherein the capping pattern is between the opposing sidewalls of the liner electrode and the protruding portions of the contact plugs.

13. The semiconductor device of claim 10:
wherein each trench among the plurality of trenches further comprises a gate dielectric between the liner electrode and the opposing sidewalls of the trench,
wherein the plurality of trenches comprises:
first and second trenches in the substrate; and
third and fourth trenches adjacent first and second sidewalls of the substrate, respectively,
wherein the source/drain regions comprise a first source/drain region between the first and second trenches,
wherein the source/drain regions further comprise a pair of second source/drain regions, one of which is between the first and third trenches, and another of which is between the second and fourth trenches, and
wherein the first source/drain region is between the pair of second source/drain regions.

14. The semiconductor device of claim 13, wherein the third and fourth trenches are larger than the first and second trenches.

15. The semiconductor device of claim 1, wherein a lower surface of the source/drain region is higher than a lower surface of the trench.

16. The semiconductor device of claim 10, wherein respective lower surfaces of the source/drain regions are higher than respective lower surfaces of the plurality of trenches.

* * * * *